(12) United States Patent
Pique et al.

(10) Patent No.: US 8,056,222 B2
(45) Date of Patent: Nov. 15, 2011

(54) LASER-BASED TECHNIQUE FOR THE TRANSFER AND EMBEDDING OF ELECTRONIC COMPONENTS AND DEVICES

(75) Inventors: Alberto Pique, Crofton, MD (US); Scott A Mathews, Germantown, MD (US); Raymond C Y Auyeung, Alexandria, VA (US); Bhanu Pratrap Sood, Gaithersburg, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 238 days.

(21) Appl. No.: 12/390,284

(22) Filed: Feb. 20, 2009

(65) Prior Publication Data

US 2009/0217517 A1 Sep. 3, 2009

Related U.S. Application Data

(60) Provisional application No. 61/029,951, filed on Feb. 20, 2008.

(51) Int. Cl.
*H05K 3/30* (2006.01)
(52) U.S. Cl. ............................................ 29/832; 29/834
(58) Field of Classification Search ............ 29/832–841, 29/739–741
See application file for complete search history.

(56) References Cited

U.S. PATENT DOCUMENTS

| | | | |
|---|---|---|---|
| 6,177,151 B1 * | 1/2001 | Chrisey et al. | 427/596 |
| 6,488,721 B1 * | 12/2002 | Carlson | 29/623.5 |
| 6,805,918 B2 * | 10/2004 | Auyeung et al. | 427/596 |
| 6,815,015 B2 * | 11/2004 | Young et al. | 506/40 |
| 6,887,650 B2 * | 5/2005 | Shimoda et al. | 430/311 |
| 6,986,199 B2 * | 1/2006 | Arnold et al. | 29/832 |
| 7,294,367 B2 * | 11/2007 | Barron et al. | 427/596 |
| 7,358,169 B2 * | 4/2008 | Zhu et al. | 438/584 |
| 7,381,440 B2 * | 6/2008 | Ringeisen et al. | 427/2.11 |
| 7,427,359 B2 * | 9/2008 | Arnold et al. | 216/6 |
| 7,786,839 B2 * | 8/2010 | Soendker et al. | 336/200 |
| 7,875,324 B2 * | 1/2011 | Barron et al. | 427/595 |
| 7,943,287 B2 * | 5/2011 | Yamazaki et al. | 430/319 |
| 2006/0105549 A1 * | 5/2006 | Duineveld et al. | 438/478 |

OTHER PUBLICATIONS

Holmes et al, Multilayer Electroformed Devices on Silicon Substrates, J. Microelectromech. Syst., 7, (1998) 416.
Holmes, et al., Laser-Assisted Assembly for Hybrid Microelectromechanical Systems, Proc. 19th Int. Congress Applications of Lasers & Electro-Optics (ICALEO), Dearborn, USA, (2000) p. D-1.
Karlitskaya et al., Study of laser die release by Q-switched Nd:YAG laser pulses, SPIE Proc. 5448, (2004) 935.
Pique, et al., Assembly and Integration of Thin Bare Die Using Laser Direct-Write, Proc. of SPIE vol. 6458 6458025, 2007.

(Continued)

*Primary Examiner* — David Angwin
(74) *Attorney, Agent, or Firm* — Amy Ressing; Roy Roberts

(57) ABSTRACT

A laser direct write method used to transfer entire single components such as semiconductor bare dies or surface mount passive and active components on a substrate or inside recess in a substrate for making embedded microelectronics is disclosed. This method laser-machine the pockets, laser-transfer the individual components inside those pockets, and then laser-print the interconnects required to "wire" the components, thus resulting in a fully assembled embedded circuit required to make a fully functional microelectronic system.

17 Claims, 16 Drawing Sheets

OTHER PUBLICATIONS

Pique, et. al., Applications of laser direct write for embedding electronics, Proc. of SPIE vol. 6606 66060R-1, 2007.

Mathews, et. al., Manufacturing Microelectronics using Lase and Place, Photonics Spectra, V. 10, p. 70, 2007.

Mathews, et. al., Use of Laser Direct-Write in Microelectronics Assembly, Journal of Laser Micro/Nanoengineering vol. 2, No. 1, p. 103, 2007.

* cited by examiner

2. EMBED BARE DIE WITHIN BOARD USING LASER TRANSFER

4. LASER PRINT POLYMER SEALANT TO ENCAPSULATE AND PROTECT EMBEDDED ELEMENTS

1. LASER MICROMACHINING FOR SHAPING CIRCUIT BOARD

3. LASER PRINT INTERCONNECTS BETWEEN DIE AND CIRCUIT BOARD

LASER-BASED TECHNIQUE FOR THE TRANSFER AND EMBEDDING OF ELECTRONIC COMPONENTS AND DEVICES

CROSS-REFERENCE TO RELATED APPLICATIONS

This Application is a Non-Prov of Prov (35 USC 119(e)) application 61/029,951 filed on Feb. 20, 2008. This Application is related to U.S. Pat. No. 6,177,151, incorporated herein in full by reference. This application is related to U.S. patent application Ser. No. 11/164,411, which is a divisional application of U.S. Pat. No. 6,986,199, filed on Jun. 9, 2004, allowed, which claims priority to U.S. Provisional Patent Application No. 60/478,471, filed on Jun. 11, 2003, both incorporated herein in full by reference. This application is related to U.S. Pat. Nos. 7,427,359, 7,001,467, and 7,014,885, all incorporated herein in full by reference.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

The size and weight of small, unobtrusive devices is dominated by discrete electrical components mounted to the internal circuit boards. In these cases, the area on the surfaces of the circuit board is very valuable for adding components but as components are added, the height and mass of the completed circuit must increase. Semiconductors are the basic building blocks used to fabricate the wide variety of electronic systems used in commercial, aerospace and defense applications. Presently, every semiconductor device or combination thereof is first mounted on an independent chip carrier, then wire bonds are attached from the contact pads of the semiconductor bare-die to the leads in the chip carrier, and finally the whole assembly is encapsulated in order to package and protect the delicate bare-die and its wire bonds. The resulting assembly on a printed circuit board is rather bulky compared with the bare-die itself and thus limits the level of miniaturization that can be achieved in a circuit requiring several packaged semiconductor devices and associated passive components. Currently there are no techniques capable of transferring, mounting and interconnecting unpackaged semiconductor devices (bare-dies) onto circuit boards or other types of substrates. Most of the steps required for the manufacture of an electronic circuit on a traditional printed circuit board rely on pick-and-place machinery which is designed to handle the packaged devices and requires their placement on the surface of the board and not inside the substrate. Techniques for embedding passive components such as resistors and capacitors have been developed to address miniaturization goals, albeit partially, since they are not capable of embedding active components. These embedding techniques rely on the addition of thick polymer film compositions on a 2-D geometry, effectively building a laminated circuit board from the bottom up, and requiring subsequent tuning in order to achieve the required resistance or capacitance values. Such approaches are inherently limited as they require development of each individual circuit design, require significant volume for the final circuit design, do not allow the fabrication of truly embedded circuits, reduce the ability to add additional components or modify designs to circuits and are not compatible with active components such as transistors, LED's and integrated circuits.

Microelectronic circuits traditionally are fabricated by placing packaged components, such as integrated circuits and surface-mount devices, on the surface of a circuit board and connecting the components together. As the demand for miniaturization has grown, however, the size of these packaged components has become a limiting factor.

There are various ways to address this limitation; for instance, application-specific integrated circuits, which eliminate the need for individual components. Instead, the entire circuit is fabricated in one fell swoop and then packaged. However, development of these single-chip designs is costly and time-consuming, and once the chips are completed, their designs are very difficult to change.

A better solution to achieving desired component densities is to place unpackaged components, such as unpackaged active semiconductor integrated circuits or bare dies, inside the circuit board. These electronic circuits, comprising the embedded components and their interconnects, promise to advance the miniaturization of electronics manufacturing. Embedding components allows a significant reduction of the weight and volume of a circuit. It also leads to shorter interconnects and reduced parasitic inductance, thereby enhancing electrical performance.

Embedding passive components, such as resistors and capacitors, inside a circuit board is not a new technology. However, embedding active semiconductor components has been demonstrated only in specialized applications because the bare semiconductor die are very fragile and tend to be damaged easily by the robotic systems (called "pick-and-place" tools) that mount the devices on a circuit board. Furthermore, pick-and-place tools are ineffective at handling small (less than 1 mm square) or extremely thin (less than 50 µm thick) die, and they are unsuitable also for high-throughput applications (more than 10 devices per second). Avoiding these limitations requires new approaches to the assembly of embedded bare die.

The use of laser-based transfer processes for the release and assembly of structures or devices was initially studied by Holmes et al. In their work, the authors demonstrated for the first time, (see Holmes et al, J. Microelectromech. Syst., 7, (1998) 416, and Holmes, et al., Proc. 19th Int. Congress Applications of Lasers & Electro-Optics (ICALEO), Dearborn, USA, (2000) p.D-1). Holmes disclosed the use of laser-transfer processes for the batch assembly of MEMS structures. Despite the success obtained with MEMS structures, this group did not attempt the application of this process to the transfer of functional semiconductor bare die. It is important to distinguish the laser-based transfer process from the well established laser lift-off technique, which can be used to release functional bare die devices such as individual GaN pn-diodes without degrading their performance. In laser lift-off, the devices are separated from a bonded structure, due to the laser-induced melting of an intermediate layer. However, in this technique, the devices are never transferred across a gap. More recently, Karlitskaya et al., SPIE Proc. 5448, (2004) 935, proposed a thermal model for the laser-release process of relatively small Si die (200 µm×200 µm). Their model showed that the release threshold is below the thermal damage threshold for the reverse side of the die (<673 K), based on heat diffusion of the absorbed laser pulse through the Si substrate. In their work, the backside of the die was exposed to the laser pulse, thus protecting the front patterned side from damage due to excessive heating. However, the authors did not discuss whether or not the dies were damaged after the transfer. Furthermore, this configuration is not very practical for embedding individual devices, due to the difficulties in establishing the electrical connections to the pads on the patterned side of the die, which end up facing the bottom of the pocket in which the device has been embedded. A better approach is to transfer the die with its patterned or active side facing up, enabling direct-write approaches to print the electrical interconnects to each pad on the die. The challenge, however, is to be able to illuminate the active region of the die with the laser release/transfer pulse without damaging it.

BRIEF SUMMARY OF THE INVENTION

A method for transferring a component to a substrate comprising providing a laser; providing a receiving substrate; providing a carrier substrate comprising a laser-transparent support having a back surface and a front surface, wherein the front surface is in connection with a polymer material, wherein said polymer material is in connection with at least one transfer component, said transfer component comprising an active side and an inactive side, wherein said active side is in connection with said polymer material, wherein the polymer material has the property of being or becoming more volatile than the transfer component when exposed to laser energy; positioning the laser in relation to the carrier substrate and exposing the carrier substrate to laser energy from the laser so that the laser energy is directed through the back surface of the carrier substrate and through the laser-transparent support to strike the polymer material at a defined carrier location with sufficient energy to volatilize the polymer material at the location, causing the transfer component to desorb from the location and be lifted from the surface of the support; and positioning the receiving substrate in a spaced relation to the carrier substrate so that the at least one component of the transfer material is deposited at a defined receiving location on the receiving substrate, wherein said inactive side of said component is in connection with said receiving substrate.

DETAILED DESCRIPTION OF THE INVENTION

Figure 1B:
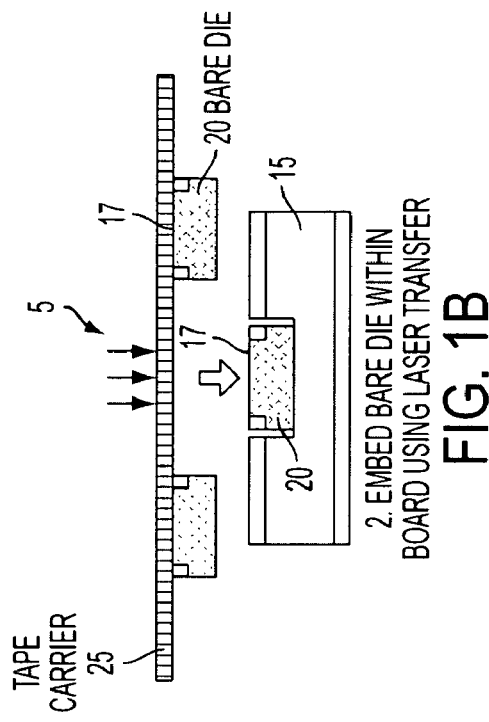
FIG. 1 is a schematic of the process utilized by the laser-assisted technique for the transfer and embedding of electronic components and devices.

In contrast to traditional pick-and-place techniques used in populating circuit boards with the required components and devices for a given electronic circuit, the laser based technique allows for the placement and interconnection of the unpackaged components and devices inside the circuit board or any other substrate for that matter. By placing the individual components inside the substrate, i.e. embedding them, it is possible to use the substrate to protect and package the individual devices, in other words, the board becomes the package. Then the use of laser printing techniques allows the direct-write of the interconnects required by the circuit and the deposition of upper encapsulating layers (if required) thus resulting in a functional circuit embedded under the substrate surface. This laser-embedded circuit occupies a fraction of the volume of that of a circuit made with traditional manufacturing processes because the packaging required by most of its components is no longer used. FIG. 1 shows a schematic of the process utilized by the laser-assisted technique for the transfer and embedding of electronic components and devices. Using Laser Direct-Write (LDW) technology (U.S. Pat. No. 6,177,151, incorporated herein in full by reference, and U.S. Pat. No. 7,427,359, incorporated herein in full by reference), the process can be performed on a variety of substrates (not just circuit boards) and also on any type of surface (flat or curved) and allows the embedding of virtually any type of miniature component such as bare dies, surface mount components, LED's and other semiconductor-based devices and integrated circuits (IC) within the required form factor. The whole process can be automated, allowing the rapid prototyping of the various adaptive electronics designs.

Laser direct-write (LDW) is a general term that encompasses modification, subtraction and addition processes that can create patterns of materials directly on substrates without the need for lithography or masks. The interaction of the laser with the substrate, or any other surface for that matter, results in material modification (melting, sintering, etc.) or material removal (ablation). The latter is better known as laser micromachining and allows the generation of the trenches or pockets where the devices are to be embedded inside the substrate. Subtractive LDW can generate patterns by either moving the substrate or scanning the laser beam or a combination of both. In additive mode, the LDW technique behaves effectively as a "functional materials printer". In this mode, the system utilizes a laser-forward transfer process for the deposition of metals, oxides, polymers and composites under ambient conditions onto virtually any type of surface. This laser printing process has been used with great success in the fabrication of sensors, microbatteries, interconnects, antennae and solar cells. In a typical LDW, the UV laser pulses can be directed either through a scanning galvo system for fast vector graphics layout over a surface, or through an objective focused at the ribbon interface, to achieve subtractive or additive LDW, respectively. More recently, LDW techniques have been utilized in the fabrication of embedded electronic devices and circuits, where interconnects were laser-printed onto the contact pads of bare die without damaging the thin metal layers. It is also possible to use the LDW technique to transfer entire single devices such as semiconductor bare dies or surface mount passive and active components inside a pocket or recess in a substrate for making embedded microelectronics, thus performing the same function of pick-and-place machines used in circuit board assembly. In principle, this means that by using a single LDW system it is possible to laser-machine the pockets, laser-transfer the individual components inside those pockets, and then laser-print the interconnects required to "wire" the components, thus resulting in a fully assembled embedded circuit required to make a fully functional microelectronic system. No other processing technique offers this broad range of capabilities with the same basic setup for the manufacture of microelectronic systems.

As used herein, a component is a discrete element which adds active or passive functionality to a planar or non-planar device or structure. The functionality can be electronic, magnetic, optical, chemical, biological, sensing in nature or any combination thereof. The size range of these components are in or below the mesoscopic regime, i.e. mm and below in dimension. Typical examples include but are not limited to surface mount resistors, capacitors, batteries, LED's, laser diodes, thin film structures, integrated circuits, ASIC's (application specific integrated circuit). These components have an active side, which is defined herein as the side to which connections (electrical or other) are made. A receiving substrate is any planar or non-planar structure. It may be passive or have active functions.

Figure 1D:
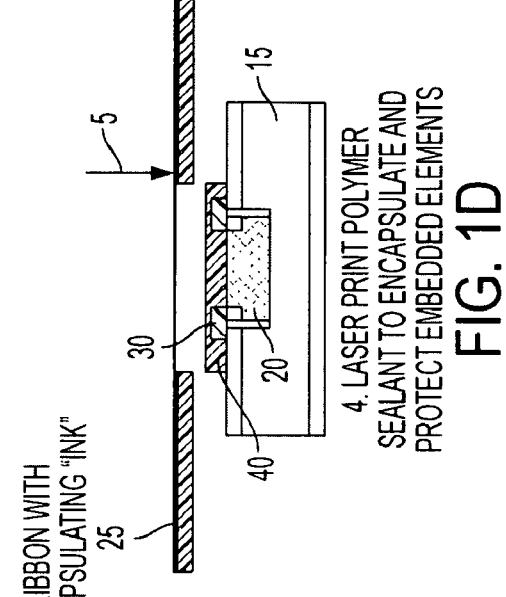
Figure 1A:
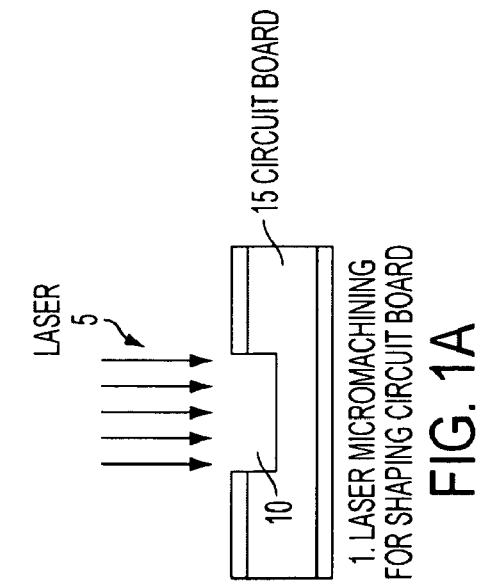
Figure 1C:
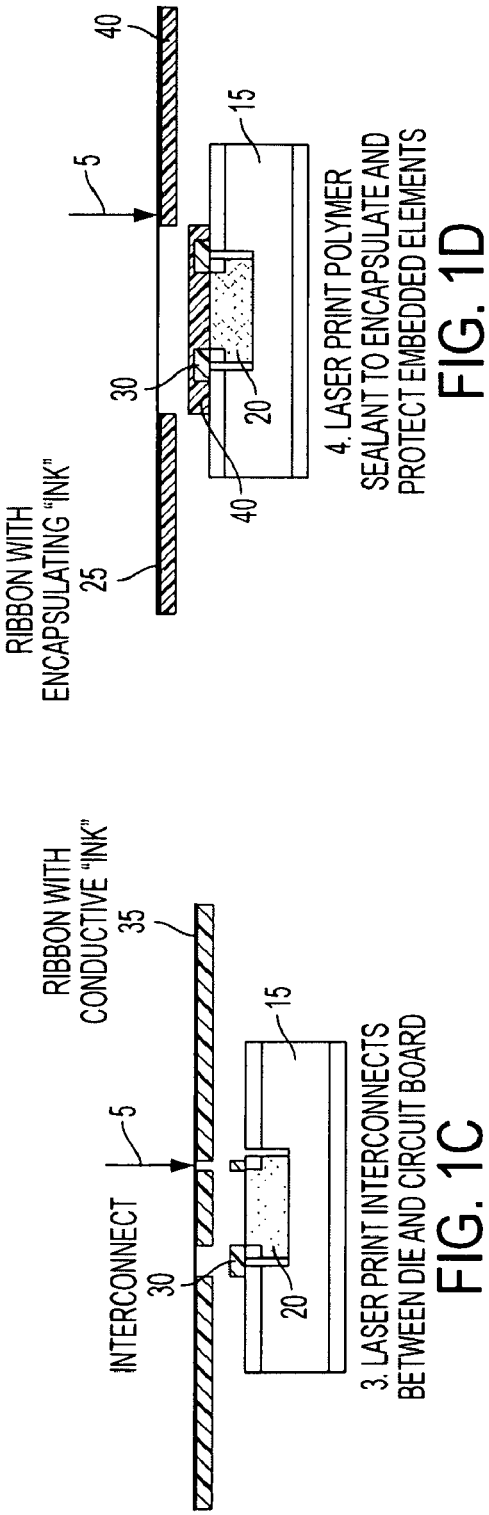
Figure 2:
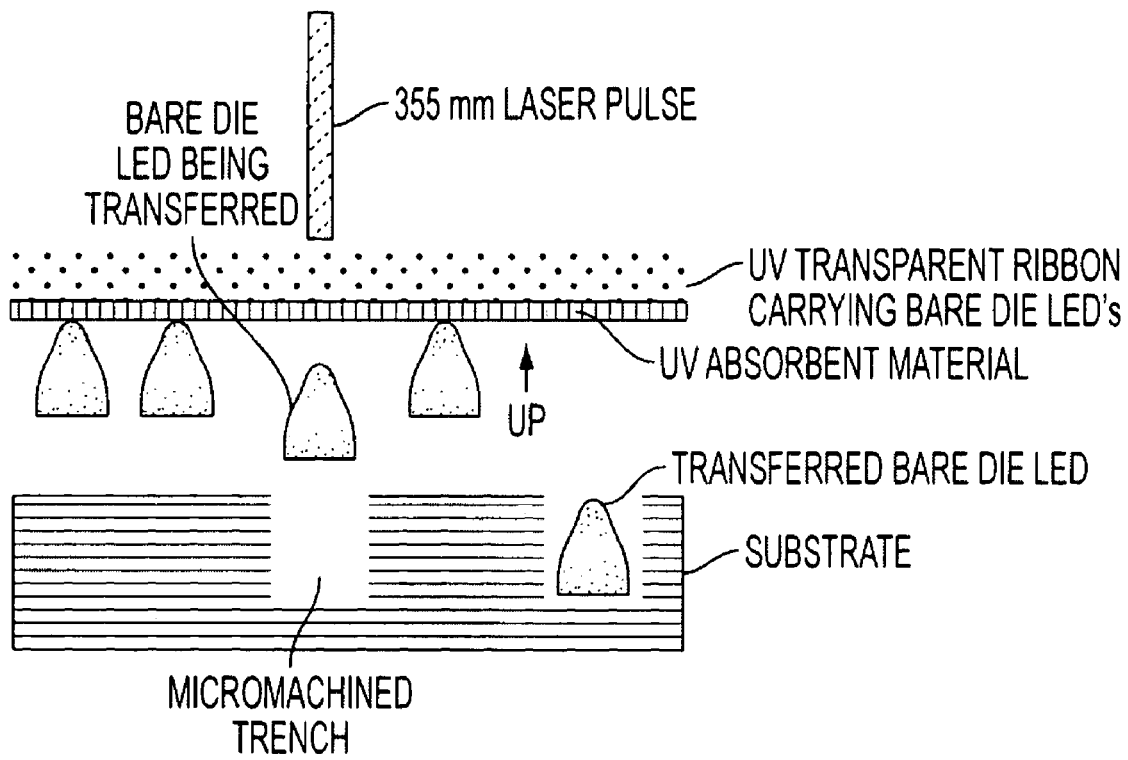
FIG. 2 is a schematic of the laser device transfer process.
Figure 3A:
FIG. 3a shows optical photographs of carrier substrate with mounted and released devices.
Figure 3B:
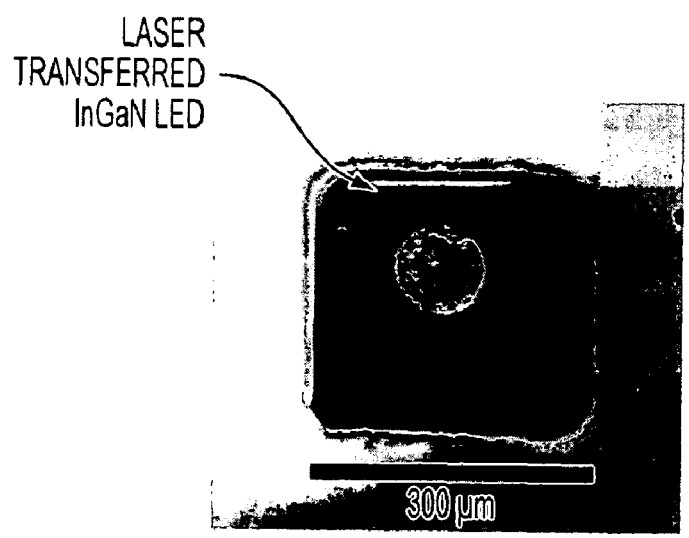
FIG. 3b shows the resulting device after being laser transferred inside the trench.

FIG. 1a shows the laser 5 micromachining of a well or trench 10 within the circuit board or any other receiving substrate 15 which will house the component (i.e. a bare die or surface mount component). FIG. 1b shows the laser 5 induced forward transfer of a component 20 to the receiving surface 15. The active side 17 of a component 20 (the side with the semiconductor patterns) is attached to a carrier substrate or tape 25 using a polymer support layer (not shown) located between the carrier substrate 25 and component 20 which strongly absorbs the UV laser pulse. The polymer will decompose upon exposure to the laser pulse and release the component 20 from the substrate carrier 25 and transfer it to the receiving substrate (underlying laser machined trench) 10. FIG. 1c shows the laser direct-write of the metal interconnects 30 between the component 20 and the circuit board or receiving substrate 15. The use of conductive epoxy pastes 35 for the interconnects 30 will accommodate any stress strain effects between the component 20 and the circuit board or receiving substrate 15 due to thermal mismatch. FIG. 1d shows the packaging of the complete assembly in order to protect it from damage. A ribbon carrier substrate 25 with encapsulating ink of polymer sealant 40 is transferred using LDW to cover and encapsulate component 20 and the interconnects 30 with the polymer sealant 40. The LDW technique has demonstrated the ability to direct-write continuous polymer membranes over conformal surfaces which can serve as planarization and encapsulation layers for this application. FIG. 1d shows the laser print polymer sealant used to encapsulate and protect embedded elements. FIG. 2 shows a schematic of the laser device transfer process and FIG. 3a shows optical photographs of carrier substrate with mounted and released devices. FIG. 3b shows the resulting device after being laser transferred inside the trench.

Figure 4A:
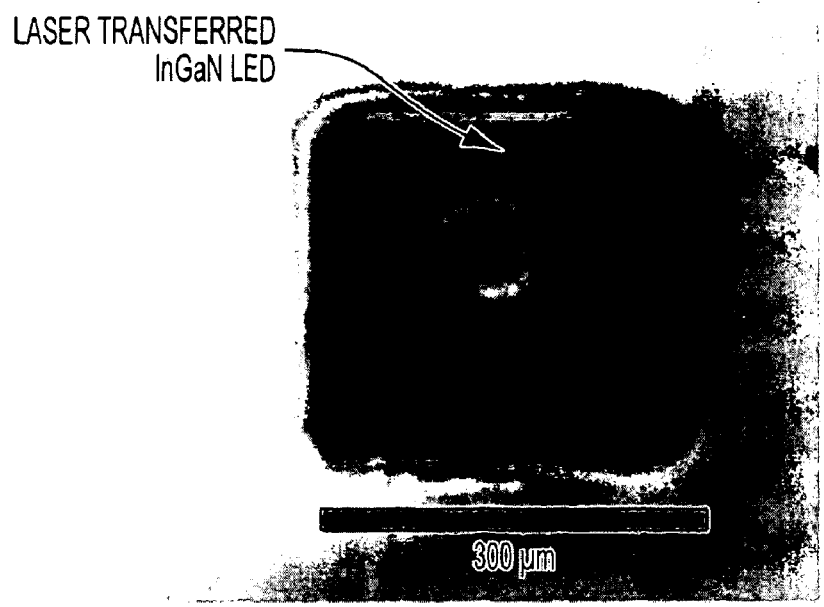
FIG. 4 shows optical micrographs of one of these LED'S "on" and "off"
Figure 4B:
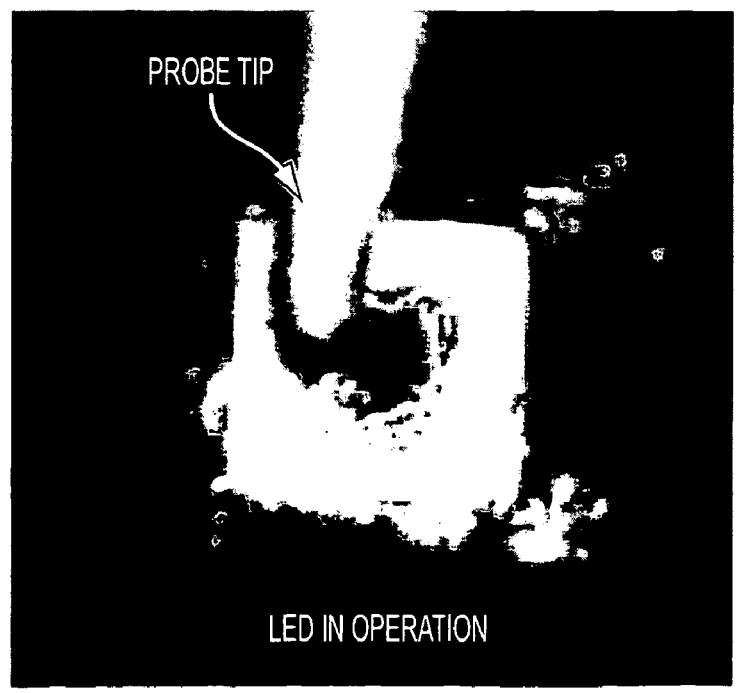

The resulting laser transferred LED bare-die devices were tested to verify that they were not damaged by the laser transfer process. FIG. 4 shows optical micrographs of one of these LED'S "on" and "off" thus demonstrating that the laser transfer does not damage the delicate semiconductor unprotected bare-dies. The laser device transfer technique is also capable of transferring individual surface mount components. In order to reduce the amount of laser energy required to release a single device from the carrier substrate in order to place it on a receiving substrate, polymer formulations with laser ablation thresholds much lower than those of the bare-die surfaces are used. Typically, the amount of laser energy used ranges from 10 mJ/cm$^2$ to 1 J/cm$^2$. An example of such a polymer include, but are not limited to, polyimide, which has a very low laser ablation threshold and it totally volatilizes upon exposure to very low energy UV laser pulses leaving no residue behind. FIG. 4 shows the laser transferred LED powered on and off, demonstrating that the bare-die LED survives the laser transfer process. The tip of the probe connecting the top electrode of the LED is shown as well.

Figure 15:
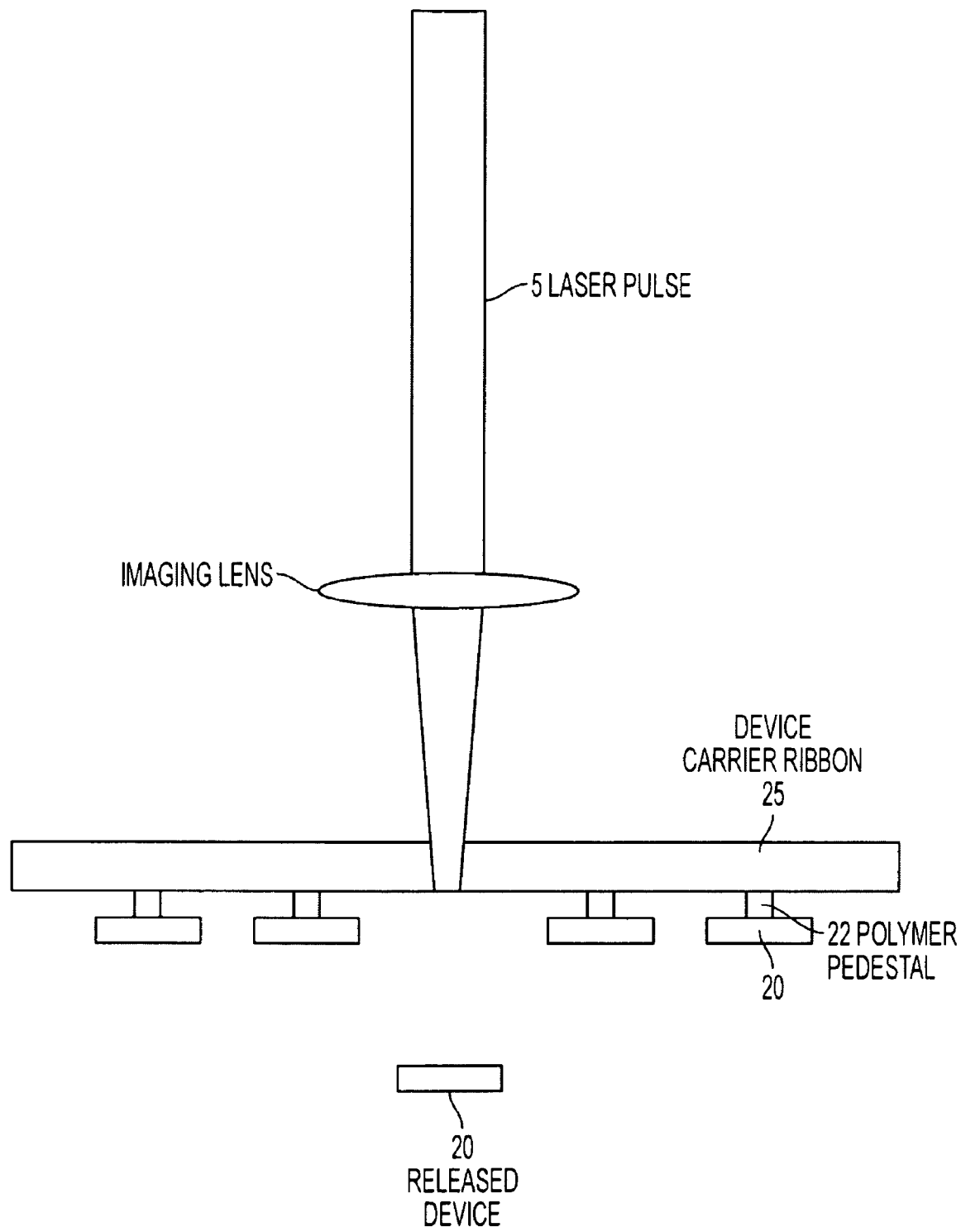
FIG. 15 shows a polymer support layer located between the component and the carrier substrate.

In order to reduce the number of laser shots fired through the back of the carrier substrate and into the polymer holding each individual component, a polymer pedestal structure has been developed. This structure results in the formation of a neck with a cross section much smaller than the total device area, but large enough to hold the component to the carrier substrate firmly until released by the laser. The reduced area allows the use of very few laser pulses, down to single laser shot, in order to decompose the polymer and release and transfer the component to the receiving substrate underneath. FIG. 15 shows this polymer support layer 22 located between the component 20 and the carrier substrate 25.

This technique of transferring and embedding electronic components enables a reduction in the size and weight of devices utilizing circuit boards with surface mount components and unpackaged semiconductor devices. The laser direct-write process can transfer devices with sizes ranging from about 0.1 up to 10 mm$^2$ onto the surface of a receiving substrate or into previously laser-machined pockets in a plastic or ceramic substrate. By directly embedding the individual circuit components onto the circuit board without individual packaging, the weight and volume of the circuits is reduced, their profile is also reduced, yet their electronic performance is improved by reducing interconnect lengths and capacitive parasitic losses. Previous disclosures related to embedding components into circuit boards rely only on material addition and build up the circuit board around the component. Here, any available circuit board may be used and modified as necessary for the embedded element. A laser micromachining process is used to accurately control the depth of machining. The laser transfer technique is used to pick-and-place the individual components and devices required to make a given circuit. The laser direct-write process is also used to add metallic conductor lines above the embedded element to make electrical contact to the rest of the board. The procedure for making electrical contact is a low temperature process. Previous techniques use screen printing and contact methods of adding materials to existing circuit boards, however these are not viable on existing circuit boards with attached components. This method of adding material is non-contact and conformal so material can be added on almost any surface. The laser direct-write technique adds material directly where needed thus eliminating the need for lithography or patterning. Laser machining and laser direct-write deposition have advantages over other non-lithographic techniques in that high resolutions (~10 μm) can be obtained. The laser device transfer technique can be used to place and embed semiconductor devices on non-traditional surfaces, allowing the placement of electronic circuits on totally new locations. For example, individual LED's could be transferred and embedded on an external surface, perhaps allowing for the optical display or transmission of information. The laser transfer and embedding of devices can be used to modify an existing electronic circuit to add more capabilities, improve its performance or disguise a completely different function from the traditionally packaged components already present on the circuit board surface. The laser micromachining depth can be controlled to the level that all the circuit board material in a region can be removed right up to an exposed metallic layer on one side of the board. Then interconnects can be added through the circuit board using the low-temperature laser direct-write technique to make electrical contact between the two sides of the board.

Figure 5:
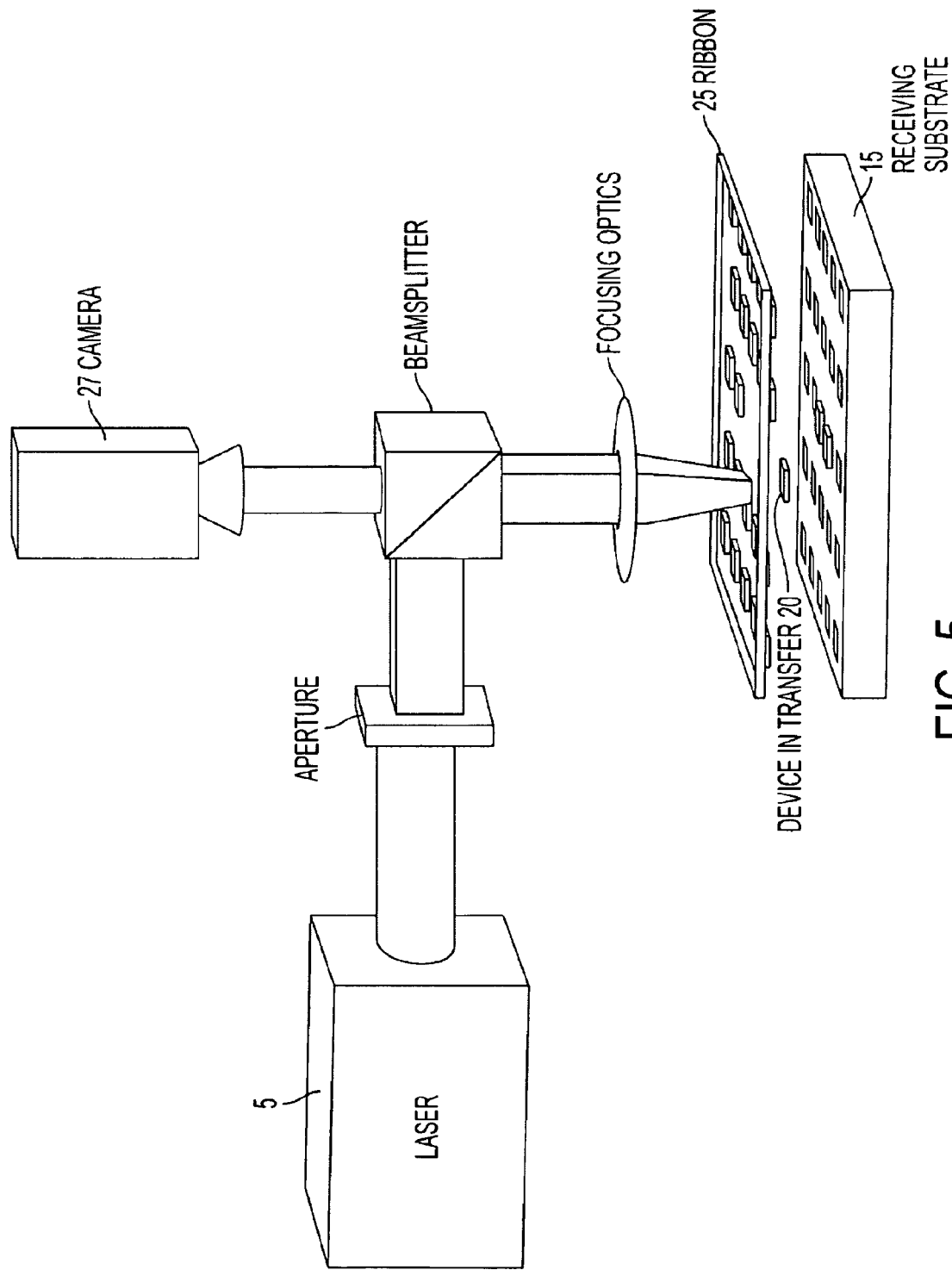
FIG. 5 shows the basic components of a laser pick-and-place system.
Figure 6A:
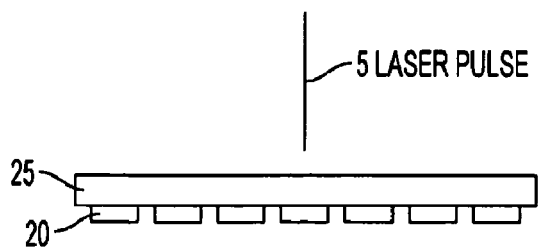
FIG. 6 shows a schematic of the device-transfer process as a function of time.
Figure 6D:
Figure 6B:
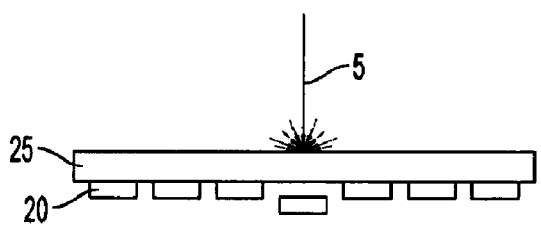
Figure 6E:
Figure 6C:
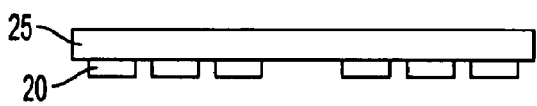
Figure 6C:
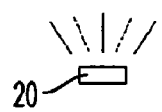
Figure 6F:
Figure 7A:
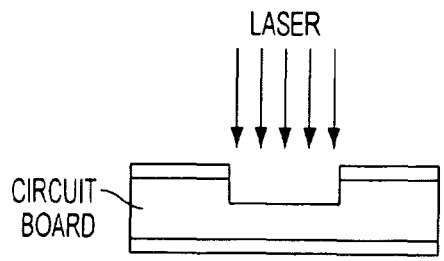
FIG. 7 shows the schematic sequence on the left shows the steps involved in laser embedding a device inside a substrate.
Figure 7B:
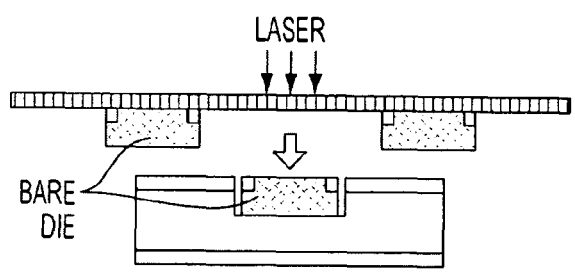
Figure 7C:
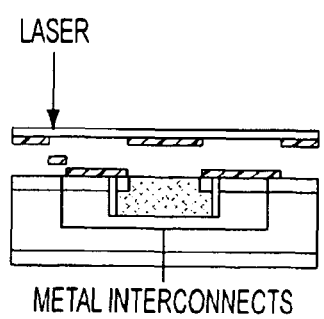
Figure 7D:
Figure 7E:
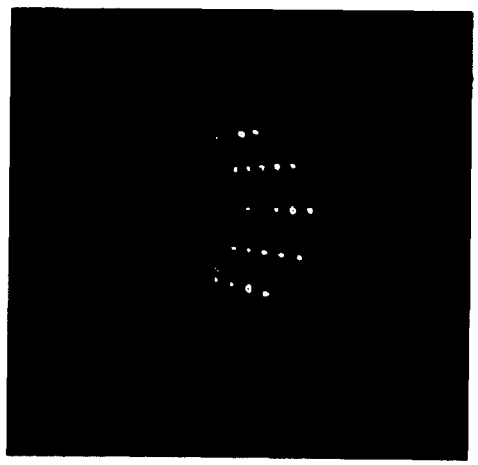

FIG. 5 shows the basic components of a lase-and-place system. The laser 5, is directed towards the "ribbon" or carrier substrate 25 which contains the components 20 to be placed on the receiving substrate 15. Assembly is achieved by aligning the supported device over the location where the device is to be embedded. Ultraviolet laser pulses are shaped by an aperture and focused to illuminate an individual device mounted on the support, referred to as the ribbon. By synchronizing the motion of the ribbon and the receiving substrate underneath with the firing of the laser pulse, it is possible to transfer a given device into a selected pocket, as shown in FIG. 5. An imaging system along the path of the laser pulse, represented by the camera 27 in the figure, is used to properly align each component 20 with the pocket in the receiving substrate 15. This process can be carried out at great speeds (more than 100 devices per second) with accurate lateral precision (within 25 µm) for short travel distances away from the support (about 100 µm).

The additive laser direct-write technique has been used with great success to transfer multicomponent liquid or gel systems. In these cases, the material to be deposited is suspended or dissolved in a solvent (organic or aqueous), forming a complex fluid, or ink, that is applied as a film onto the transparent ribbon. When the ink absorbs the laser pulse, a small fraction of the volatile solvent vaporizes and propels the remaining ink away from the ribbon.

The transfer of the ink toward the receiving substrate takes place at low laser fluences ($<100$ mJ/cm$^2$), and, hence, the ink is transferred without significant changes to its properties. Maintaining the ink's properties is essential when printing electronic inks to form metallic interconnects because it allows patterns deposited on rough or curved surfaces or across steps of varying height to remain continuous and conformal. This laser-printing process has successfully fabricated sensors, microbatteries, interconnects, antennae and solar cells.

Using a thin sacrificial polymer layer instead of a volatile solvent to attach individual bare-die semiconductors, surface-mount components or any other part to the transparent ribbon allows release and transfer of the part with a single laser pulse. The key to this process is the selection and processing of the sacrificial polymer layer. By choosing polymers that fully decompose into volatile by-products when exposed to a laser pulse, it is possible to use the generated vapors to propel a device or component away from the carrier substrate or ribbon and minimize heating of the component. For the transfer to take place in a reproducible fashion and to minimize the possibility of damaging the devices, the sacrificial polymer film must be processed into a thin and uniform layer. The polymer layer typically ranges from about 10 nm to about 10 microns in thickness.

The devices then are placed onto this layer and the polymer cured, thus attaching the devices to the ribbon support. Several photopolymers such as photoresists have been used for this purpose. The left side of FIG. 6 shows a schematic of the device-transfer process as a function of time, whereas the right side shows stroboscopic micrographs taken at time intervals corresponding to those from the schematic. The micrographs show the transfer of 1-mm$^2$ silicon substrates 20. In a and d, the laser pulse has not yet hit the sacrificial polymer layer, and the device is still attached to the ribbon. In b and e, the laser ablates the polymer, causing its vaporization, which results in the ejection of the device 20 from the ribbon 25. Note the bright flash from the ablated polymer almost engulfing the substrate in e. In c and f, the device is released and travels away from the ribbon toward the receiving substrate (not shown).

The lase-and-place process is a contactless technique and thus allows the transfer of minute and ultrathin devices that easily would be damaged by mechanical pick-and-place tools. In applying this technique to various types of semiconductor bare die, it has been shown that it is possible to transfer complete devices with the active surface facing the laser pulse without damage. Hence, the devices are embedded with their contact pads facing up, enabling laser printing of the required interconnects. In FIG. 7, the schematic sequence on the left shows the steps involved in laser embedding a device inside a substrate. The photos on the right show a laser-embedded array of LEDs on a flexible polyimide substrate. The circuit is composed of an array of bare-die blue LEDs each laser-transferred into laser-machined pockets in a 125-µm-thick flexible polyimide substrate. After transfer, a polymer is applied to encapsulate the bare-die LEDs, and lines of silver nano-ink are laser-printed to form the interconnects that are required to address each of the devices individually.

Figure 8:
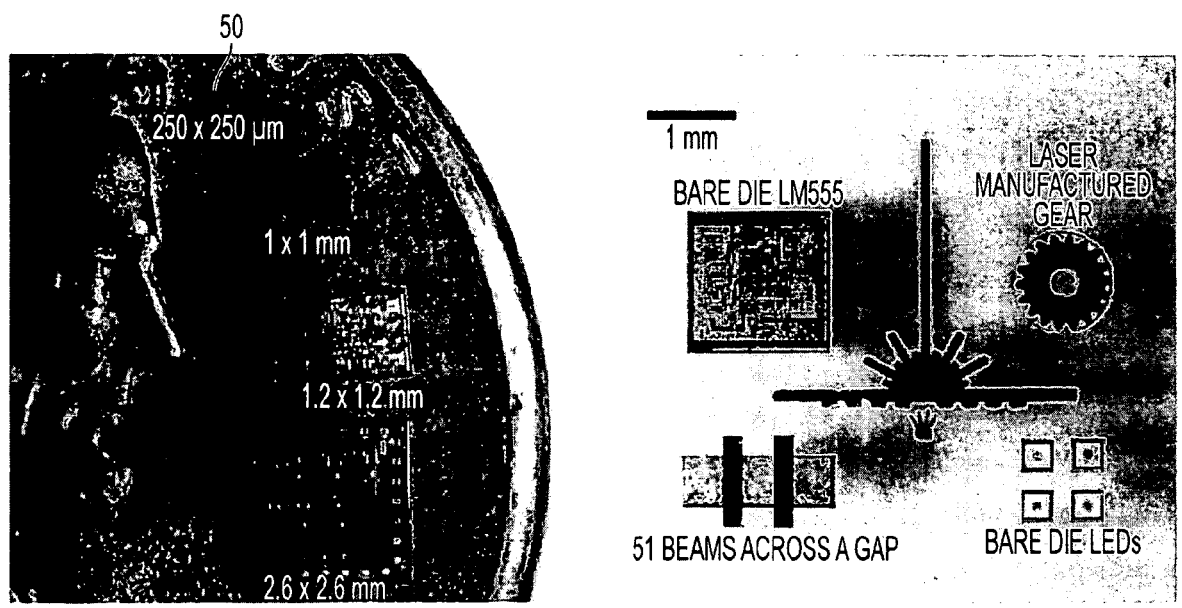
FIG. 8 shows dissimilar components ranging from single-LED bare die to micro-machined gears can be transferred next to each other.

The advantages of the lase-and-place process become apparent when the technique is used to transfer heterogeneous types of devices and components. It is possible to place and assemble dissimilar components or parts onto the same substrate by simply mounting ribbons with different components under the laser beam. This simple capability is not possible with traditional pick-and-place tools, which must be adjusted to accommodate various sizes and shapes. Using the lase-and-place approach, a simple adjustment of the aperture determining the size and shape of the laser beam is all that is required. Totally dissimilar parts ranging from single-LED bare die to micro-machined gears can be transferred next to each other with the same tool, merely by changing ribbons (FIG. 8). Furthermore, metal patterns can be laser-printed as well, by switching the ribbon to one with a silver ink (FIG. 8, right).

Laser-based transfer techniques such as the one described here allow modification and customization of embedded circuits for specific applications. Moreover, the required circuit layout easily can be reconfigured to fit within a desired form factor. Such capabilities allow the placement of microelectronic systems in places that are beyond the reach of current manufacturing processes. An example of such a need is in the placement of components onto flexible or curved substrates, where there is a need for the fabrication of microelectronic circuits cheaply, cleanly and in precise locations for the next generation of portable, flexible electronics. See example of flexible circuit made by the present system in FIG. 7.

Figure 9:
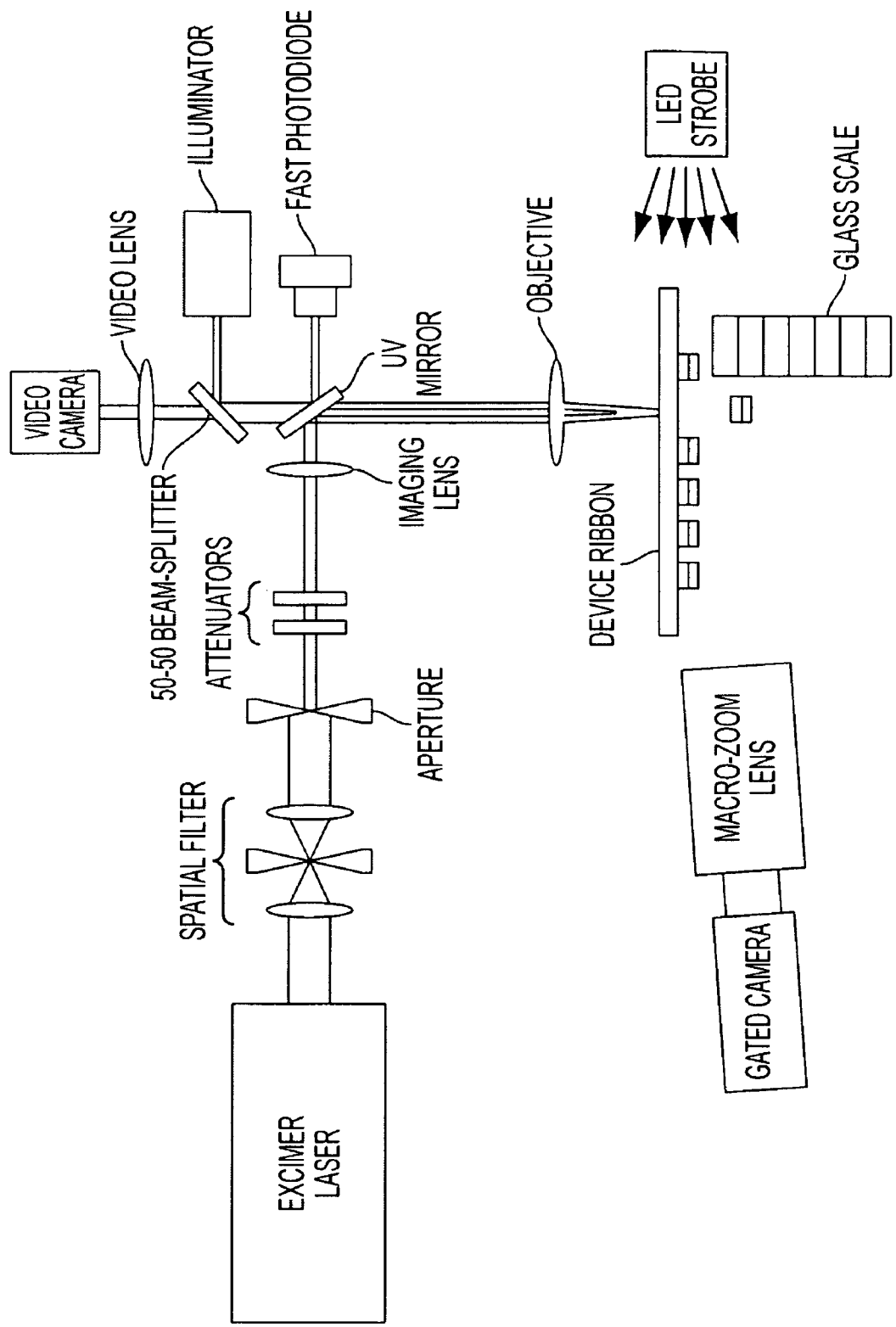
FIG. 9 is a schematic of the set-up used to image the laser-driven release and transfer of devices.

A similar setup was used for the laser-forward transfer of bare die and SMD (surface mount) devices. Both an excimer laser and a diode pumped solid-state (DPSS) frequency tripled laser may be used as the source of UV pulses. In order to achieve more reliable and faster device transfers, it is preferable to use a larger area laser beam capable of uniformly illuminating the whole surface of the device allowing for the transfer to occur with a single laser pulse. Due to the various types of devices with different sizes and shapes, a larger beam like the one generated by an excimer laser is preferable, thus allowing each laser pulse to be apertured to fully illuminate the surface of virtually any microelectronic device. FIG. 9 shows a schematic of the setup for the laser-transfer of devices using an excimer laser (LPX300, Lambda Physik) operating at 248 nm (KrF gas, 15 ns pulsewidth). FIG. 9 is a schematic of the set-up used to image the laser-driven release and transfer of devices (bare die and surface mount components). For these experiments an excimer laser (KrF, 248 nm, 15 ns pulsewidth), however solid state lasers such as flash light pumped and DPSS lasers can also be used for this method.) The following sections describe details of the laser-transfer of bare die and SMD devices, the setup required for recording images of the devices during transfer and the types of devices that were laser transferred for this work.

Setup for Laser-Induced Forward-Transfer of Individual Devices: Individual devices such as bare die semiconductor chips, Si substrates and SMD capacitors resistors and LEDs were mounted on quartz plates using spin-coatable polymer solutions such as photoresists, semiconductor wafer protective coatings and polyimide precursors. Any of these polymers was spin-coated onto the quartz plates, after which the devices were pressed against the polymer layer, and then the whole assembly was dried in a hot plate. The whole assembly is referred to as the ribbon or in this case the "device ribbon". The resulting ribbon was then mounted, device side down, onto a cantilever extending from an X-Y translation stage. The wafer was positioned in the system (shown schematically in FIG. 2) under the objective and in the field of view of the camera, so that individual devices could be exposed to a UV laser pulse and imaged simultaneously.

Bare die may also be loaded onto a low adhesion, "die transfer tape". The die transfer tape was fixed on a glass microscope slide using "double stick" tape. A thin layer of FSC-L surface coating (Microposit, Inc.) was spin-coated on a quartz wafer at 1,400 rpm for 15 seconds. The slide containing the devices was pressed, device side down, onto the wet FSC-L layer. A small weight (20 grams) was placed onto the assembly, which was then dried at 100° C. for 30 minutes. The glass slide with the transfer tape was then removed, leaving the devices glued to the quartz wafer by a thin layer of dried FSC-L surface coating. The quartz wafer was then rinsed for 2 to 4 minutes in methanol to re-move unwanted FSC-L. This resulted in an array of devices glued to the quartz wafer on small "pedestals" of FSC-L.

The beam from the LPX300 laser was spatially filtered and directed onto a circular, metal aperture. By changing the size of the circular aperture, a variable spot size of uniform intensity could be generated to illuminate the device to be transferred. A fast photodiode (ThorLabs, DET210) placed behind the last UV turning mirror and calibrated with a laser power meter was used to measure the energy of each laser pulse. Coarse adjustments of the delivered pulse energy were performed by changing the high voltage settings on the laser. Finer adjustments were achieved by placing a series of quartz plates in the beam, between the aperture and the imaging lens. For the present work, the delivered fluence was adjustable and measurable from about 150 to 1400 mJ/cm$^2$.

Imaging of the Laser Device Transfer Process: The transfer and strobe imaging of each device was controlled with a digital delay/pulse generator (Stanford Research, DG535). The DG535 is manually triggered, and generates two pulses, designated A and B. The A pulse is coincident with the manual trigger and triggers a monochromatic digital camera (Pixelink, PL-A781) to acquire a single frame. The camera requires approximately 12 msec to clear the image buffer, reset, and begin integrating the subsequent image frame. The B pulse from the DG535 is therefore delayed by 12.5 msec, to ensure that the entire event is captured by the camera. The B pulse triggers the firing of a single pulse from the laser. The delay between the rising edge of the B pulse and the arrival of the laser pulse at the die was measured to be less than 2 μsec. The B pulse is also routed to a second pulse generator (HP, 214B). The 214B is operated in a gated mode, such that it generates a series of 1 μsec pulses at variable frequencies. The 214B pulses trigger a LED strobe (Stoker-Yale, 3000SD). The LED strobe illuminator outputs 1 μsec, optical flashes (660 nm) which illuminate the device "in flight", and was positioned behind the device under test, pointed toward the digital camera, such that the camera viewed the shadow cast by the device. By changing the duration of the B pulse from the DG535 and the frequency of the 214B, the LED strobe can be programmed to emit an arbitrary number of flashes, with an arbitrary delay between flashes. For this work, 4 or 5 flashes were used with delays from 140 to 450 μsec between them.

Types of Devices Laser-Transferred: A series of device "ribbons" were assembled as described above. They included 0.3 mm by 0.3 mm InGaN LEDs, 1.2 mm by 1.2 mm LM555 bare die, 2.6 mm by 2.6 mm ASIC bare die (all from Semi-Dice, Inc.) and 0402 series SMD devices (the 0402 series measure 1 mm×0.5 mm in area). Various types of SMD devices were laser-transferred such as capacitors and resistors (Panasonic) and LED's (Liteon). Additionally, Si substrates measuring 1 mm×1 mm×0.5 mm thick and 1 mm×1 mm×10 μm thick (ultra-thin) were also laser transferred. FIG. 8 shows an optical micrograph of some of the bare die and Si substrates that were laser-transferred arranged from smallest (top) to largest (bottom) in size. The smallest device 50 corresponds to the InGaN LED and can barely be seen between Lincoln's head and the letter "U" in the coin. Some of the bare die devices, in particular the LM555 (which is a common timer chip) were tested to verify their operation after the laser-transfer process. The LM555 bare die were tested in an a stable multivibrator configuration using a probe station in order to connect each of the die's eight pads to an external driving circuit and its output signal displayed in an oscilloscope. The output from several laser-transferred bare dies was compared to that of devices that had not been exposed to the laser-transfer process.

Figure 10A:
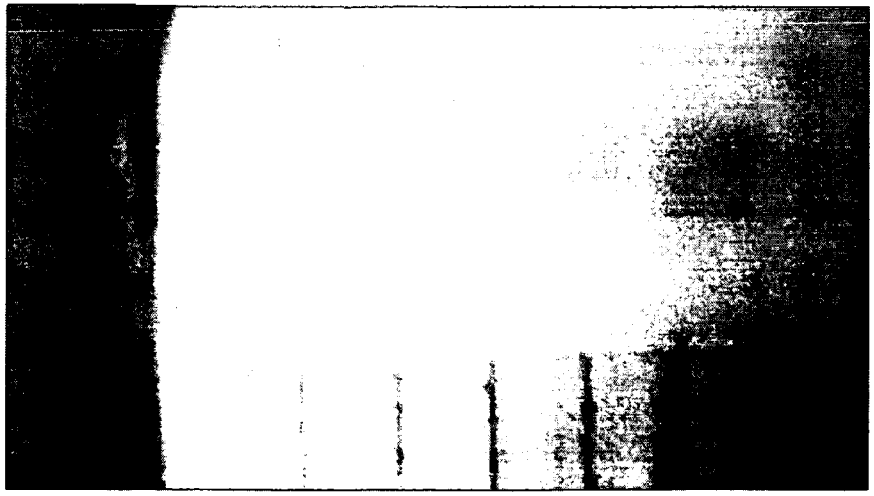
FIG. 10 shows a multiple exposure, shadow image of three different devices during laser-transfer.
Figure 10B:
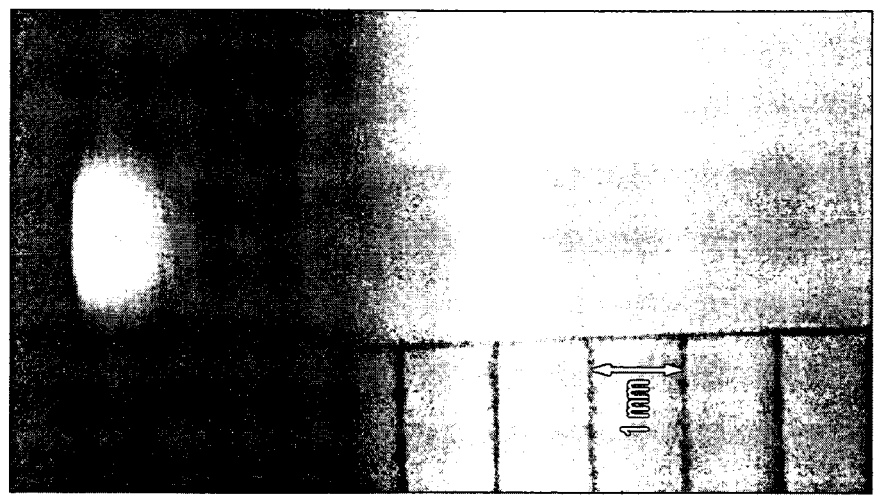
Figure 10C:
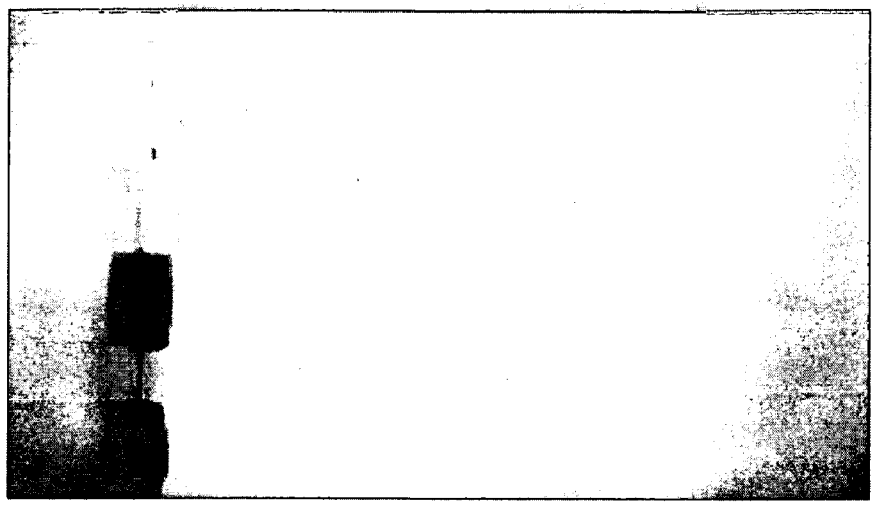
Figure 11:
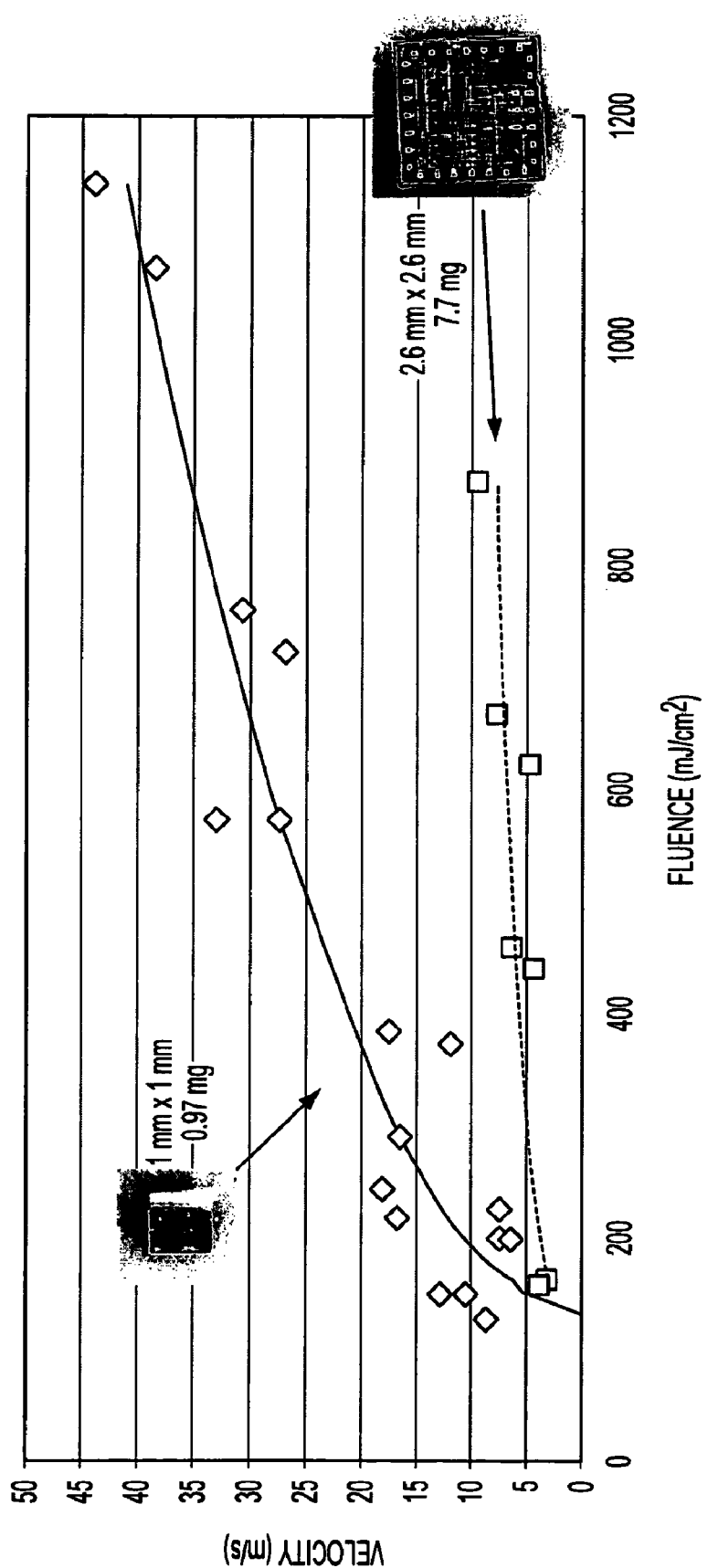
FIG. 11 is a plot of the velocity of the components as a function of laser fluence.

FIG. 10 shows a multiple exposure, shadow image of three different devices during laser-transfer. FIG. 10(a) corresponds to a 1 mm×1 mm Si substrate, FIG. 10(b) shows a LM555 bare die (1.4 mm×1.4 mm) and FIG. 10(c) shows a SMD device (1 mm×0.5 mm). In both FIGS. 10(a) and 10(b) a glass scale with 1 mm rulings is visible in the left side of the image. This scale was used to gauge the distance traveled by the devices between exposures. It should be pointed out that the time interval between exposures is not the same for each of the images shown in FIG. 10. Rather, these images are shown to illustrate the dynamics of the transfer process for devices with different footprints and shapes. The multiple exposures in FIG. 10 show that the devices rotate or tumble as they travel away from the ribbon, with the degree of rotation increasing between the smaller footprint device, 10(a), to that of the larger one, 10(b). The rate of rotation for the SMD device, 10(c), appears to be the highest. This is probably due to the fact that both the Si substrate and LM555 bare die have very flat surfaces resulting in a very uniform polymer layer binding them to the quartz plate, while the SMD surface is far from flat due to the solder bumps at the edges of the device. The interaction of the laser with a polymer layer of uniform thickness allows for a more uniform transfer, while a polymer layer of variable thickness results in a highly unstable device release. This non-uniform release also explains the significant tilting-away from the laser transfer axis, i.e., the SMD device in 10(c) is not released perpendicular to the ribbon surface. These images are characteristic of most of the transfer images acquired with our setup for similar devices. To evaluate the kinetic energy and velocities of the devices during transfer, two series of images of transfers as a function of laser fluence for two different components, 1 mm² Si substrates and 2.6 mm×2.6 mm ASIC bare dies, were recorded. The resulting images allowed the velocity of the components as a function of laser fluence to be calculated and the results are plotted in FIG. 11. From this data it is clear that for a given laser fluence, the lighter components are transferred at a higher velocity than the heavier ones. The solid line for the 1 mm² corresponds to a fit based on the relationship discussed by Holmes et al:

$$v = \sqrt{\frac{2\eta(E - E_r)}{m}}$$

where v is the velocity, η is the fraction of available energy converted into kinetic energy, E is the laser fluence, $E_r$ is the ablation threshold of the sacrificial polymer layer and m is the mass per unit area of the device. The solid curve for the 2.6 mm×2.6 mm ASIC bare dies does not represent a fit to this formula, but rather is a visual aid.

Figure 12:
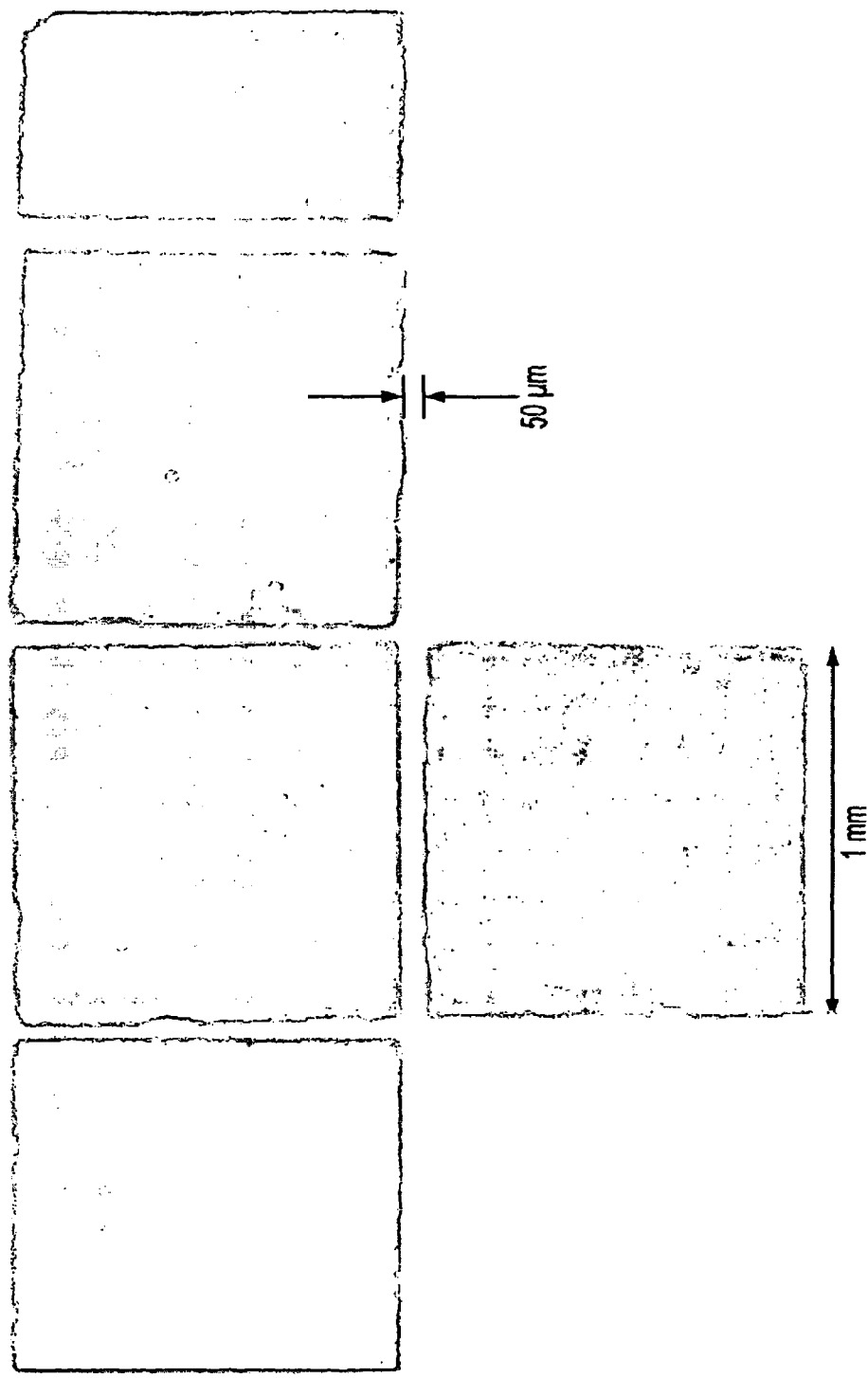
FIG. 12 shows an image of five 1 mm×1 mm ultra-thin (10 μm thick) Si substrates transferred next to each other.

Despite the tumbling and tilting-away of the devices once released from the ribbon, it is still possible to achieve very high placement resolution between adjacent devices and also transfer very delicate devices such as extremely thin Si substrates (representative of the class of ultra-thin bare die required for the next generation of RFID tags and other flexible electronics). FIG. 12 shows an image of five 1 mm×1 mm ultra-thin (10 μm thick) Si substrates transferred next to each other with a spacing of 50 μm to demonstrate the device placement control achievable with laser-transfer. Some minor rotation of some of the substrates can be observed; however, the overall placement control is quite good, despite some rotation and tilting-away from the transfer axis. In fact, fine-tuning the transfer laser parameters, adjusting the device ribbon-to-substrate gap, and increasing the uniformity of the device ribbon shall further improve the overall placement control. The image in this figure also shows that despite their very low thickness (10 μm) these Si substrates were laser-transferred intact (no cracks or fractures). The features visible in the sample surface are residue left from the polymer used to mount the substrates to the ribbon. The use of substrates of this thickness is beyond what is currently required for RFID tags (50 to 100 μm thick at the moment) but demonstrates that laser direct-write processes can be used to transfer these types of devices with high yields. It should be pointed out that current pick-and-place machines are not capable of transferring 50 μm thick RFID bare die with acceptable yields (much less 10 μm thick ones), due to breakage of the substrates during their mechanical release form the carrier tape.

Figure 13A:
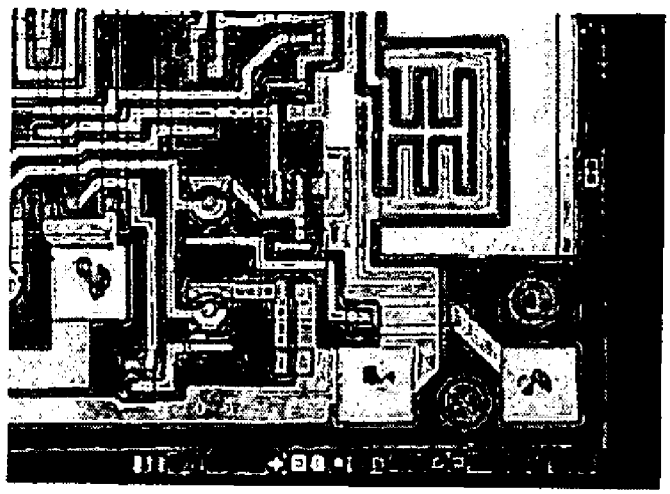
FIG. 13 shows optical micrographs of two LM555 bare die, un-transferred and transferred.
Figure 13B:
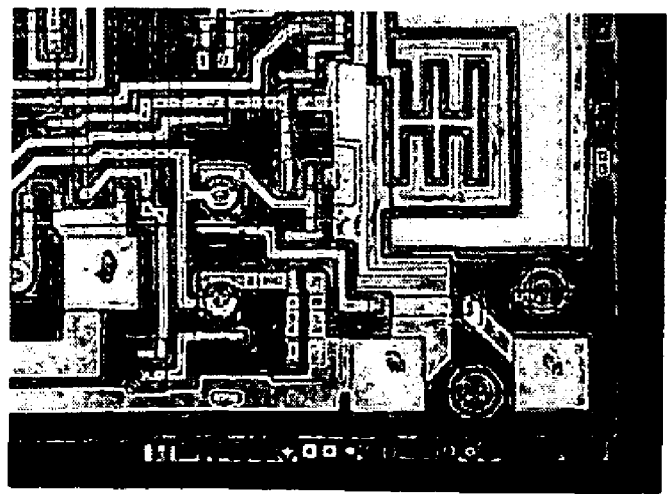
Figure 13C:
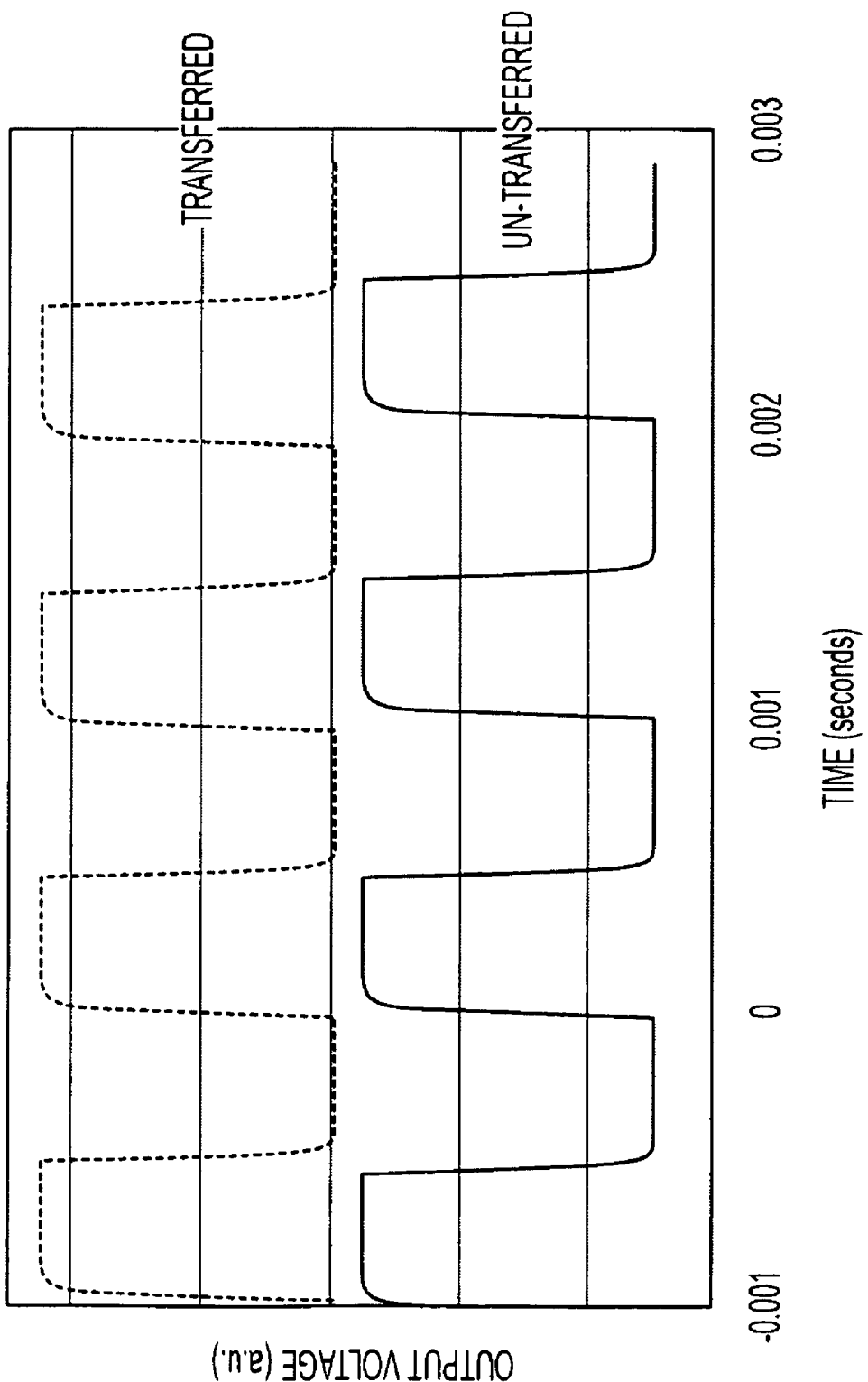
Figure 14:
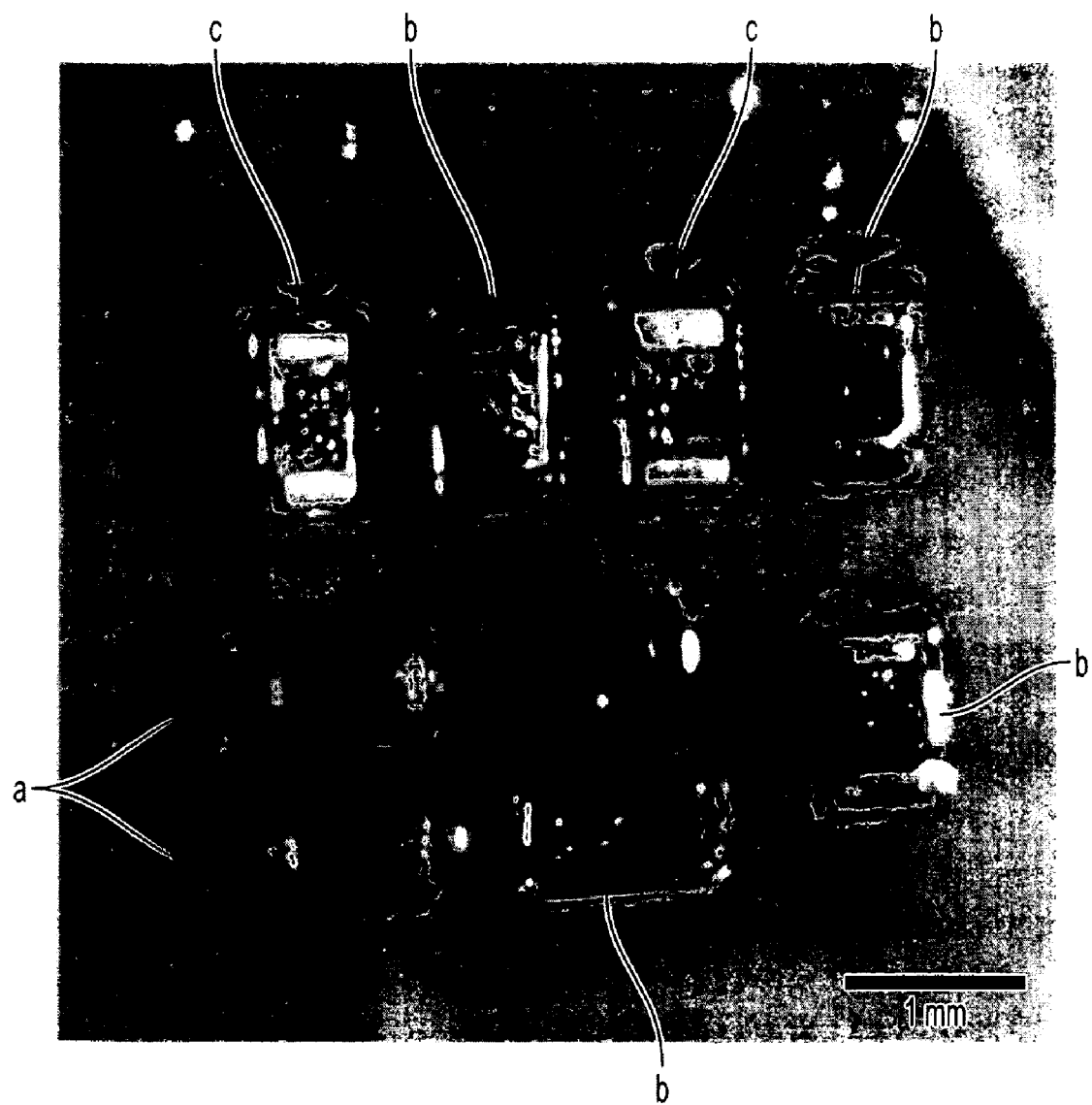
FIG. 14 shows a micrograph of an embedded blinker circuit, comprised of several SMD capacitors, resistors and LEDs and a LM555 bare die driving chip.

Several LM555 bare die were forward transferred using the laser direct-write process and tested to verify that their functionality was not affected or degraded by the laser pick-and-place process. FIGS. 13(a) and 13(b) show optical micrographs of two LM555 bare die, un-transferred and transferred, respectively. As the images demonstrate, no visible damage to the patterned surface of the bare die can be noticed. The only features noticeable are the marks made by the probe station tips used to test the devices. After transfer, several LM555 were collected and connected in a square wave generator configuration using a probe station. Their output was displayed on an oscilloscope to verify their correct operation. Each of the devices was functional after transfer and its output waveform is shown in FIG. 13(c) and compared against that of a non laser-transferred LM555 bare die. Finally, FIG. 14 shows a micrograph of an embedded blinker circuit, comprised of several SMD capacitors, resistors and LEDs and a LM555 bare die driving chip, where each device was laser-transferred into its corresponding laser-machined pocket inside the plastic substrate (ULTEM-1000). Although the devices were not connected, this figure shows how all the components required for a complete embedded circuit can be assembled using what can be referred as a laser-pick-and-place system, despite their different size and shape. This demonstrates the enormous versatility of laser direct-write processes as applied to laser-transfer of microelectronic devices.

Laser forward transfer and laser direct-write techniques are poised to play an important role in the development of the next generation of electronic systems as work towards the goal of complete device integration steadily progresses. For example, future microelectronic designs will require integration of many different and increasingly smaller components. To achieve this, it will be necessary to accurately place small-scale components and devices such as semiconductor bare die and surface mount passive devices which might be very thin or too small to be properly handled by mechanically driven pick-and-place machinery. Furthermore, such systems might not be capable of placing the above-mentioned devices onto non-planar surfaces or embedding them inside pockets. The use of laser transfer techniques such as the one developed at NRL, could allow the placement of these devices in a reliable fashion and at high speeds on virtually any type of surface. These results open the door for the development of unique laser-based microelectronics fabrication tools. Such tools would be capable of fabricating, embedding and interconnecting each of the components required for a fully operational microelectronic circuit directly on a substrate, including delicate bare die IC's. This work has shown that LDW techniques can be used to release and transfer microelectronic components such as surface mount devices and bare die IC's without affecting their performance. The devices can be directly transferred into pockets using this technique in order to fabricate embedded microelectronic circuits. The fact that the bare die IC's are not damaged upon laser illumination of their active surface, demonstrates the ability to use LDW processes as effective laser-based pick-and-place systems for die transfer and assembly. Furthermore, using such a laser-based direct-write system for microelectronics manufacture has the advantage that the resulting embedded circuits can easily be modified and customized for any given application, while at the same time, the circuit layout can also be reconfigured to fit within a desired form factor. Such a capability would allow the placement of microelectronic systems in places that are inconceivable for current circuit manufacture processes. Much work remains before this process becomes accepted by the microelectronics manufacturing world; however, its simplicity, flexibility and versatility make it a promising technique for the assembly of the next generation of microelectronic systems.

What is claimed as new and desired to be protected by Letters Patent of the United States is:

1. A method for transferring a component to a receiving substrate comprising
   providing a laser;
   providing a receiving substrate;

providing a carrier substrate comprising a laser-transparent support having a back surface and a front surface, wherein the front surface is in connection with a polymer material, wherein said polymer material is in connection with at least one component, said component comprising an active side and an inactive side, wherein said active side is in connection with said polymer material, wherein the polymer material has the property of being or becoming more volatile than the component when exposed to laser energy;

positioning the laser in relation to the carrier substrate and exposing the carrier substrate to laser energy from the laser so that the laser energy is directed through the back surface of the laser-transparent support to strike the polymer material at a defined carrier location with sufficient energy to volatilize the polymer material at the location, causing the component to be released from the surface of the support; and positioning the receiving substrate in a spaced relation to the carrier substrate so that the at least one component is deposited at a defined receiving location on the receiving substrate, wherein said inactive side of said component is in connection with said receiving substrate.

2. The method of claim 1 further comprising providing a conductive epoxy material on said carrier substrate;

positioning the laser in relation to the carrier substrate and exposing the carrier substrate to laser energy from the laser so that the laser energy is directed through the back surface of the laser-transparent support to strike the conductive epoxy material at a defined carrier location with sufficient energy to cause the conductive material to desorb from the location and be lifted from the surface of the support; and positioning the receiving substrate in a spaced relation to the carrier substrate so that the conductive material is deposited at a defined receiving location on the receiving substrate, wherein said conductive material creates connections to said active side of said component.

3. The method of claim 1 further comprising providing a polymer sealant material on said carrier substrate;

positioning the laser in relation to the carrier substrate and exposing the carrier substrate to laser energy from the laser so that the laser energy is directed through the back surface of the laser-transparent support to strike the polymer sealant material at a defined carrier location with sufficient energy to cause the polymer sealant to desorb from the location and be lifted from the surface of the support; and positioning the receiving substrate in a spaced relation to the carrier substrate so that polymer sealant is deposited at a defined receiving location on the receiving substrate, wherein said polymer sealant is deposited at a location to encapsulate said at least one component.

4. The method of claim 1 wherein said component is a surface mount resistor, capacitor, battery, LED, laser diode, thin film structure, integrated circuits, ASIC's or combinations thereof.

5. The method of claim 1 wherein said polymer material is polyimide.

6. The method of claim 1 wherein said polymer material is a photopolymer.

7. The method of claim 1 wherein said receiving substrate is configured to have a trench for receiving said component.

8. The method of claim 1 wherein the polymer ranges from about 10 nm to about 1 micron in thickness.

9. The method of claim 1 wherein said laser energy ranges from about 10 $mJ/cm^2$ and 1 $J/cm^2$.

10. The method of claim 1 wherein said polymer is uniform in thickness.

11. The method of claim 1, wherein one laser deposits more than 100 components per second.

12. The method of claim 1, wherein said component is deposited with a lateral precision of within 25 μm.

13. The method of claim 1, wherein said component has a size of from about 0.1 $mm^2$ to 10 $mm^2$.

14. The method of claim 1, wherein said component is a bare die integrated circuit.

15. The method of claim 4, wherein said component is a bare die integrated circuit.

16. A method for transferring a component to a receiving substrate comprising providing a laser;

providing a receiving substrate;

providing a carrier substrate comprising a laser-transparent support having a back surface and a front surface, wherein the front surface is in connection with a polymer material, wherein said polymer material is in connection with at least one component, said component comprising an active side and an inactive side, wherein said active side is in connection with said polymer material, wherein the polymer material has the property of being or becoming more volatile than the component when exposed to laser energy;

positioning the laser in relation to the carrier substrate and exposing the carrier substrate to laser energy from the laser so that the laser energy is directed through the back surface of the laser-transparent support to strike the polymer material at a defined carrier location with sufficient energy to volatilize the polymer material at the location, causing the component to be released from the surface of the support; and positioning the receiving substrate in a spaced relation to the carrier substrate so that the at least one component is deposited at a defined receiving location on the receiving substrate, wherein said inactive side of said component is in connection with said receiving substrate, wherein said component is a bare die integrated circuit comprising a surface mount resistor, capacitor, battery, LED, laser diode, thin film structure, integrated circuits, ASIC's or combinations thereof.

17. The method of claim 16, wherein one laser deposits more than 100 components per second with a lateral precision of within 25 μm.

* * * * *